United States Patent
Bogomolni

(10) Patent No.: US 10,393,800 B2
(45) Date of Patent: Aug. 27, 2019

(54) CIRCUIT ARRANGEMENT

(71) Applicant: SICK AG, Waldkirch/Breisgau (DE)

(72) Inventor: Igor Bogomolni, Berlin (DE)

(73) Assignee: SICK AG, Waldkirch (DE)

( * ) Notice: Subject to any disclaimer, the term of this patent is extended or adjusted under 35 U.S.C. 154(b) by 4 days.

(21) Appl. No.: 15/618,639

(22) Filed: Jun. 9, 2017

(65) Prior Publication Data
US 2017/0356954 A1 Dec. 14, 2017

(30) Foreign Application Priority Data
Jun. 10, 2016 (EP) ..................... 16173926

(51) Int. Cl.
| | |
|---|---|
| G01R 31/28 | (2006.01) |
| H03M 1/06 | (2006.01) |
| H03M 1/10 | (2006.01) |
| H03M 1/12 | (2006.01) |
| G01R 1/30 | (2006.01) |

(52) U.S. Cl.
CPC ........... G01R 31/2829 (2013.01); G01R 1/30 (2013.01); H03M 1/0609 (2013.01); H03M 1/1004 (2013.01); H03M 1/1028 (2013.01); H03M 1/124 (2013.01)

(58) Field of Classification Search
CPC ...... G01R 31/28; G01R 31/2829; G01R 1/30; H03M 1/06; H03M 1/10; H03M 1/12; H03M 1/18
See application file for complete search history.

(56) References Cited

U.S. PATENT DOCUMENTS

| | | | |
|---|---|---|---|
| 2005/0093722 A1* | 5/2005 | Smith ................ | H03M 1/1028 341/118 |
| 2005/0156580 A1 | 7/2005 | Hashimoto | |
| 2013/0049713 A1* | 2/2013 | Ogawa ............... | H03M 1/1019 323/234 |

FOREIGN PATENT DOCUMENTS

| | | |
|---|---|---|
| DE | 102005030276 A1 | 12/2006 |
| DE | 102008041841 A1 | 3/2010 |
| EP | 2869147 A2 | 5/2015 |
| JP | H11-214996 A | 8/1999 |

OTHER PUBLICATIONS

European Search Report dated Nov. 25, 2016 in corresponding European Patent Application No. 16173926.3.

* cited by examiner

*Primary Examiner* — Neel D Shah
(74) *Attorney, Agent, or Firm* — Nath, Goldberg & Meyer; Jerald L. Meyer

(57) ABSTRACT

The invention relates to a circuit arrangement comprising a control device, an input circuit for applying an input signal, a conditioning circuit electrically connected to the input circuit for converting the input signal into a measured signal, an analog-to-digital converter electrically connected to the conditioning circuit for converting the measured signal into a digital value, and a reference source that outputs a known reference signal. In this respect, a first switching apparatus is provided that selectively separate the input signal from the conditioning circuit or supplies it to the conditioning circuit and a second switching apparatus is provided that selectively supplies the reference signal to the input circuit or separates it from the input circuit, wherein the control device is configured to determine an offset error and to determine a gain error of the circuit arrangement.

19 Claims, 1 Drawing Sheet

CIRCUIT ARRANGEMENT

Figure 1:
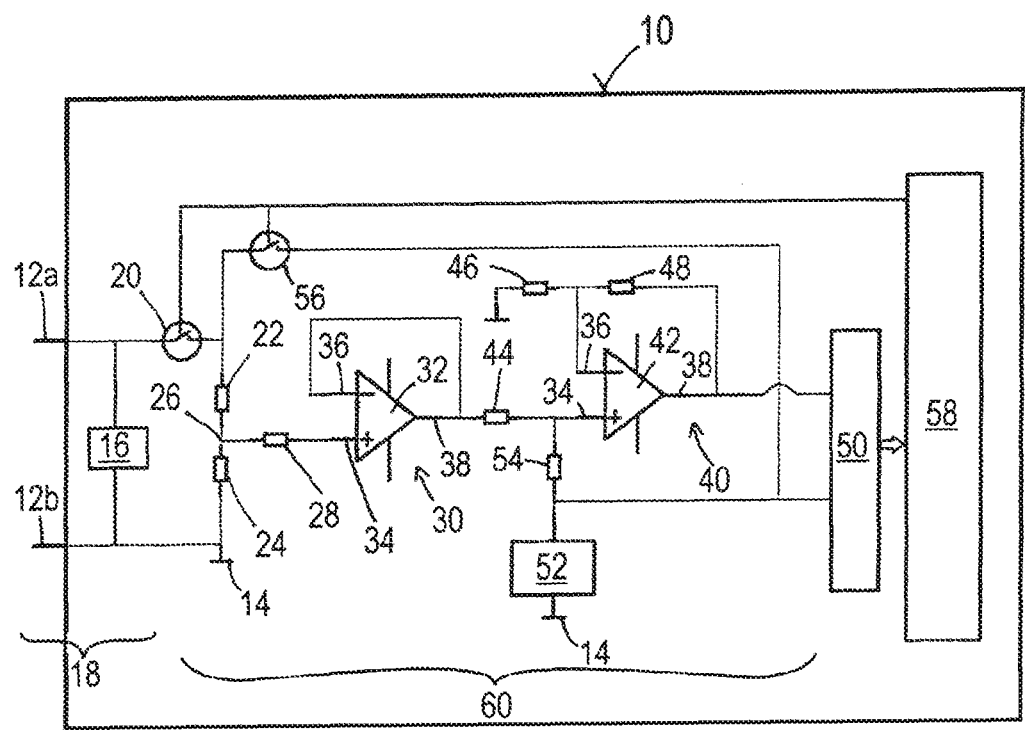

The present invention relates to a circuit arrangement for evaluating an analog electrical signal comprising a control device, an input circuit for applying an input signal, a conditioning circuit electrically connected to the input circuit for converting the input signal into a measured signal, an analog-to-digital converter electrically connected to the conditioning circuit for converting the measured signal into a digital value, and a reference source that outputs a known reference signal.

Such circuit arrangements serve, for example, to convert analog electrical signals (i.e. input signals) into digital values, with the digital values e.g. being able to be further processed by the control device.

It must in particular be ensured that the circuit arrangement works correctly on the use of the circuit arrangement in safety devices, i.e. for example in devices that satisfy "safety integrity level 3 (SIL3). The circuit arrangement must, for example, here be able to recognize defects in the circuit arrangement itself such as short-circuits on line or manipulations of or changes to components.

It is therefore the underlying object of the invention to provide a circuit arrangement for use in safe devices that is configured to recognize defects of the circuit arrangement reliably and in a simple manner.

This object is satisfied by the circuit arrangement in accordance with claim 1 and in particular in that a first switching apparatus is provided that selectively separates the input signal from the conditioning circuit or supplies it to the conditioning circuit and in that a second switching apparatus is provided that selectively supplies the reference signal to the input circuit or separates it from the input circuit. The control device is in this respect configured to determine an offset error of the circuit arrangement when the input signal is separated from the conditioning circuit and the reference signal is not supplied to the input circuit and/or to determine a gain error of the circuit arrangement when the input signal is separated from the conditioning circuit and the reference signal is supplied to the input circuit.

The invention is based on the recognition that different known signals can be evaluated (e.g. measured) by the circuit arrangement by the provision of the switching apparatus, wherein the offset error and/or the gain error of the circuit arrangement can be determined from a comparison of the (actually measured) digital value and of an expected digital value. It is in turn possible to draw a conclusion on defects in the circuit arrangement from the offset error and the gain error, whereby in particular increased safety demands can be satisfied.

In addition, a calibration of the circuit arrangement can take place by the detection of the offset error and/or of the gain error. It is thus made possible in accordance with the invention to calibrate the circuit arrangement and simultaneously to determine defects such as offset errors and gain errors, a temperature drift or component defects. A high precision of the circuit arrangement can also be achieved with inexpensive components in this manner.

The digital value that is generated from the measured signal by the analog-to-digital converter will also be called the measured digital value in the following.

The offset error and/or the gain error can be systematic defects in the circuit arrangement. The offset error can be a defect that causes too high or too low a digital value, wherein the offset error is at least substantially independent of the magnitude of the input signal. The gain error can be a defect that causes too high or too low a digital value, wherein the gain error depends on the magnitude of the input signal or of the signal applied to the conditioning circuit. The gain error, for example, increases linearly with the input signal.

For the event that the first switching apparatus separates the input signal from the conditioning circuit and the second switching apparatus does not supply the reference signal to the input circuit, the signal applied to the conditioning circuit is "zero", i.e. lying on a ground potential, for example. With such a connection of the switching apparatus, the analog-to-digital converter would therefore have to output a digital value that corresponds to an input signal of zero. If the digital value differs from the digital value expected in this case, a conclusion can be drawn on the offset error from the difference. The difference in particular corresponds to the offset error.

The fact is utilized in the determination of the offset error that even when a gain error is present, the gain error only has small effects on the digital value since a signal of substantially zero is amplified and the gain error can thus only have small effects.

For the determination of the gain error, the first switching apparatus separates the input signal from the conditioning circuit and the reference signal is supplied to the input circuit by means of the second switching apparatus. A defined signal, namely the reference signal, is hereby applied to the input circuit (and to an input of the conditioning circuit). If the reference signal in the conditioning circuit is amplified by an unwanted factor, this can in turn be determined since the expected digital value for the reference signal is known as the input signal. A conclusion can then be drawn on the gain error from a difference from the expected digital value and the digital vale measured in this state. The gain error can be determined, for example, by the calculation of the ratio between the measured digital value and the expected digital value.

It is, for example, assumed in the determination of the gain error that the offset error is zero. Alternatively, the offset error can also first be subtracted from the digital value determined during the determination of the gain error and the gain error can subsequently be determined.

The digital values measured on the determination of the offset error and the gain error are preferably checked as to their plausibility after the determination of the offset error and the gain error. Defects in the circuit arrangement can hereby be discovered, wherein e.g. particularly high offset errors and/or gain errors can indicate defects in the circuit arrangement.

The input signal can, for example, be an analog signal of a temperature sensor or pressure sensor. The input circuit serves to forward the input signal to the conditioning circuit. The conditioning circuit converts the input signal into the measured signal. In this respect, the conditioning circuit in particular serves to change the input signal such that the input signal can be converted as precisely as possible into a digital value using the analog-to-digital converter. After the change of the input signal by the conditioning circuit, the input signal is called the measured signal. The measured signal is finally supplied to the analog-to-digital converter that converts the measured signal into the digital value. A change of the input signal in this respect does not have to mean that the magnitude (e.g. the voltage) of the input signal is changed. The change can e.g. also take place by an impedance converter that makes it possible to output the measured signal with a higher current than would be possible with the input signal.

The reference source can, for example, output a known voltage value or a known current value that serves as a reference signal. Alternatively, the reference signal can also e.g. be a pulsed signal or a signal of variable magnitude.

Further advantageous further developments of the invention can be seen from the description, from the Figures and from the dependent claims.

In accordance with an advantageous embodiment, the control device is connected to the analog-to-digital converter and corrects the gain error and/or the offset error in the digital value. The control device can convert the digital value into a digital output value that is corrected by the gain error and/or the offset error For this purpose, the offset error can first be deducted from the digital value and the result of this subtraction can subsequently be multiplied by a factor that compensates the gain error.

In accordance with a further advantageous embodiment, the control device is configured to determine the offset error and/or the gain error repeatedly, preferably during a regular operation of the circuit arrangement. Temperature changes, but also component changes and the like in the operation of the circuit arrangement can be recognized and compensated, for example, by a cyclic determination of the offset error and/or of the gain error.

The control device is particularly preferably configured to determine the offset error and the gain error after one another and to evaluate the input signal between the determination of the offset error and of the gain error. This means that the circuit arrangement in each case only has to interrupt the measurement or evaluation of the input signal for a short time to determine one of the errors. A "normal" measurement and evaluation of the input signal (i.e. of the signal to be detected by the circuit arrangement) is subsequently carried out. The other one of the errors is only then determined. The interruptions of the actual measurement procedure, that are only brief to this extent, can thus be unnoticeable for a user of the circuit arrangement.

In accordance with a further advantageous embodiment, the control device is configured to recognize component defects of the circuit arrangement with reference to the offset error and/or to the gain error and to output a warning signal on a recognition of a component defect. Component defects, short-circuits, interruptions and erroneous value changes of components must in particular be able to be recognized in safety-critical applications from safety integrity level 3 onward. It may be necessary here, for example, to recognize a doubling of the resistance value of a component or its halving.

In accordance with a further advantageous embodiment, the input signal comprises two connector terminals for the input signal and a protective circuit, wherein one of the connector terminals is preferably connected to a ground potential. The input signal can be applied to the connector terminals, wherein voltage peaks of the input signal that could result in damage to the circuit arrangement can, for example, be filtered by the protective circuit. The protective circuit can for this purpose be connected between the connector terminals and can e.g. comprise a Zener diode. The input circuit can additionally also comprise the first switching apparatus.

In accordance with a further advantageous embodiment, the conditioning circuit comprises a voltage divider. The voltage divider can be connected such that it is connectable between the two connector terminals and divides a voltage of the input signal with, for example, a dividing ratio of 1:10.

The voltage divider can be separable from one of the connector terminals by means of the first switching apparatus.

The voltage divider can in particular comprise two resistors connected in series, wherein an output of the voltage divider is provided between its two resistors. The voltage divider can serve to measure input signals having high voltages without the analog-to-digital converter having to have an equally high input voltage range.

In accordance with a further advantageous embodiment, the conditioning circuit comprises an impedance converter, in particular a voltage follower. The impedance converter can preferably comprise a first operational amplifier. A non-inverting input of the first operational amplifier can be coupled to the output of the voltage divider. An inverting input of the first operational amplifier can be electrically connected to the output of the first operational amplifier.

The impedance converter can serve to minimize a current of the input signal flowing through the connector terminals and in this manner to reduce changes of the input signal by the measurement.

In accordance with a further advantageous embodiment, the conditioning circuit comprises an amplifier, in particular an inverting amplifier. The amplifier can comprise a second operational amplifier, wherein a non-inverting input of the second operational amplifier can be coupled to the output of the voltage follower. An inverting input of the second operational amplifier can be connected to the ground potential via a first resistor and simultaneously to an output of the second operational amplifier via a second resistor. A gain of the amplifier can be set via the ratio of the values of the first and second resistors. The circuit arrangement can be adapted to the input signal on the basis of the selectable gain.

In accordance with a further advantageous embodiment, the conditioning circuit adds the reference signal to the measured signal. An offset is added to the measured signal by the addition of the reference signal to the measured signal, said offset e.g. also permitting negative input signals to be evaluated with the analog-to-digital converter even if the analog-to-digital converter is e.g. only able to process positive signals. The reference signal can in this respect be selected as so large that it corresponds to half the maximum signal level processable by the analog-to-digital converter. Negative and positive input signals of equal amounts can be processed by the circuit arrangement in this manner.

The reference source particularly preferably comprises a voltage source. This means that the reference source outputs a predefined and preferably invariable voltage. The predefined voltage of the reference source can be temperature-stabilized.

Alternatively or additionally, the reference source can also comprise a current source. The current source outputs a predefined and preferably invariable current. The predefined current can also be temperature-stabilized.

The reference source can also be a voltage source on the use of the circuit arrangement for the current measurement.

The reference source can additionally be directly connected to the analog-to-digital converter to recognize possible defects of the analog-to-digital converter or of the reference source. For this purpose, the reference signal can be converted into a digital value by the analog-to-digital converter, wherein a digital value expected in this respect is compared with the actually measured digital value to recognize defects of the analog-to-digital converter and/or of the reference source.

In accordance with a further advantageous embodiment, the input circuit comprises a shunt resistor. The shunt resistor can serve for the indirect current measurement provided that currents are to be measured by the circuit arrangement. The shunt resistor can be connected between the connector terminals of the input circuit. If a current now flows through the shunt resistor, the voltage dropping at the shunt resistor can be used as the input signal.

If the circuit arrangement serves for the measurement of voltages, the reference source can be a voltage source. If the circuit arrangement in contrast serves for the detection of currents, the reference source can be configured as a current source. In addition, both a voltage source and a current source can also be included by the reference source so that it is possible to switch between the voltage source and the current source.

The magnitude of the reference signal can preferably be changeable and/or settable. The circuit arrangement can hereby be tested at different working points. To set the reference signal, the reference source itself can be changeable and/or different reference sources can be provided that are selectively used.

In accordance with a further advantageous embodiment, the circuit arrangement comprises a second input circuit for applying a second input signal, a second conditioning circuit electrically connected to the second input circuit for changing the input signal into a second measured signal, a second analog-to-digital converter electrically connected to the second conditioning circuit for converting the second measured signal into a second digital value and a second reference source that outputs a known second reference signal. A further first switching apparatus is preferably provided in this respect that selectively separates the input signal from the second conditioning circuit or supplies it to the second conditioning circuit and a further second switching apparatus is provided that selectively supplies the reference signal to the second input circuit or separates it from the second input circuit. The control device is preferably configured to determine a second offset error of the circuit arrangement when the second input signal is separated from the second conditioning circuit and the second reference signal is not supplied to the second input circuit and/or to determine a second gain error of the circuit arrangement when the second input signal is separated from the second conditioning circuit and the second reference signal is supplied to the second input circuit.

The second offset error and/or the second gain error are, for example, caused by the second input circuit and/or the second conditioning circuit.

The circuit arrangement can therefore generally be of a redundant design, wherein a respective plurality of input circuits and/or conditioning circuits and/or analog-to-digital converters are present arranged in parallel. The input circuits, the conditioning circuits and/or the analog-to-digital converters can each be of identical design. The above statements on possible further developments of the circuit arrangement apply accordingly to the redundant parts of the circuit arrangement, that is, for example, to the second input circuit, to the second conditioning circuit, to the second analog-to-digital converter, and to the further switching apparatus.

In accordance with a further advantageous embodiment, the control device is configured to determine the second offset error and/or the second gain error at different points in time than the offset error and/or the gain error. With a redundantly designed circuit arrangement, a respective part of the circuit arrangement can in this manner be available for "regular" measurements of the input signal. The detection of the offset errors and/or of the gain errors can nevertheless take place in normal operation.

The first and second input signals can be the same or different. For example, a sensor coupled to the circuit arrangement can be redundantly present so that input signals from different sensors are forwarded to the input circuits. Particularly high safety demands can be satisfied due to this redundancy.

A further subject of the invention is a method of evaluating an analog electrical signal in which an input signal is applied to an input circuit, a conditioning circuit electrically connected to the input circuit converts the input signal into a measured signal, an analog-to-digital converter electrically connected to the conditioning circuit converts the measured signal into a digital value, and a reference value outputs a reference signal. In this respect, the input signal is selectively separated from the conditioning circuit by means of a first switching apparatus or is supplied to the conditioning circuit and the reference signal is selectively supplied to the input circuit by means of a second switching apparatus or is separated from the input circuit, wherein an offset error is determined when the input signal is separated from the conditioning circuit and the reference signal is not supplied to the input circuit and/or a gain error is determined when the input signal is separated from the conditioning circuit and the reference signal is supplied to the input circuit.

The statements made on the circuit arrangement in accordance with the invention, in particular with respect to advantages and preferred embodiments, apply to the method in accordance with the invention.

Figure 2:
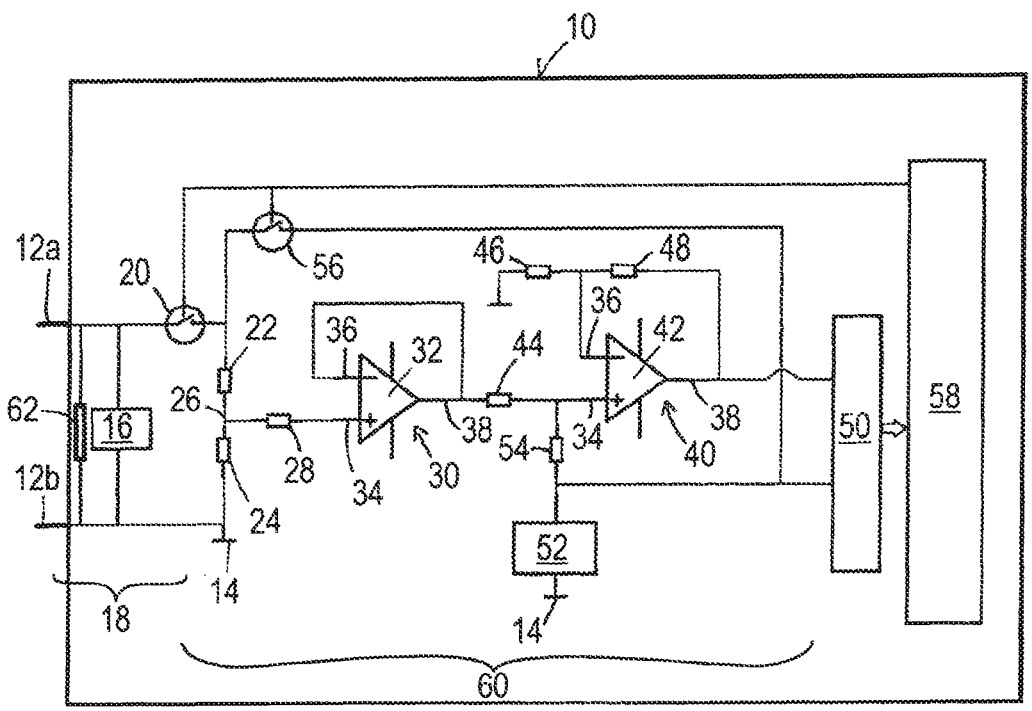

The invention will be described in the following purely by way of example with reference to the drawings. There are shown:

FIG. 1 a first embodiment of a circuit arrangement that serves for the voltage measurement; and FIG. 2 a second embodiment of a circuit arrangement that serves for the current measurement.

FIG. 1 shows a first embodiment of a circuit arrangement 10 that serves for the evaluation of an analog electrical signal (i.e. of an electrical input signal). The circuit arrangement 10 comprises a first connector terminal 12a and a second connector terminal 12b to which the electrical input signal can be applied. The second connector clamp 12b is electrically connected to the ground potential 14. An EMC protective circuit 16 that is electrically connected to the connector terminals 12 is arranged between the two connector terminals 12. The EMC protective circuit 16 serves to lead off overvoltage.

A first switch 20 is connected to the first connector terminal 12a and permits the connector terminal 12a to selectively be connected to a first resistor 22 or to separate the connector terminal 12a from the first resistor 22. The connector terminals 12 and the EMC protective circuit 16 and the first circuit 20 together form an input circuit 18.

The first switch 20 is connected to a second resistor 24 by means of a first resistor 22, with the second resistor 24 also being coupled to the ground potential 14. The first and second resistors 22, 24 are connected in series and together form a voltage divider whose output 26 is connected to a voltage follower 30 via a third resistor 28. The output 26 is disposed between the first and second resistors 22, 24.

The voltage follower 30 comprises a first operational amplifier 32 whose non-inverting input 34 is connected to the output 26 of the voltage divider via the third resistor 28. An inverting input 36 of the first operational amplifier 32 is coupled to an output 38 of the first operational amplifier 32.

An inverting amplifier 40 is connected downstream of the voltage follower 30. The inverting amplifier 40 comprises a second operational amplifier 2 whose non-inverting input 34 is connected to the output 38 of the first operational amplifier 32 via a fourth resistor 44. The inverting input 36 of the second operational amplifier 42 is coupled to the ground potential 14 via a fifth resistor 46. At the same time, the inverting input 36 of the second operational amplifier 42 is connected to the output 38 of the second operational amplifier 42 via a sixth resistor 48. The output 38 of the second operational amplifier 42 is at the same time also connected to an analog-to-digital converter 50. A measured signal that is converted into a digital value by the analog-to-digital converter 50 is applied to the output 38 of the second operational amplifier 42 in the operation of the circuit arrangement 10.

A voltage source is provided in the circuit arrangement 10 as a reference source 52 that supplies a reference signal to the non-inverting input 34 of the second operational amplifier 42 via a seventh resistor 54. The reference signal and thus also the reference source 52 can selectively be connected by means of a second switch 56 to the first resistor 22 and to the first switch 20 or can be separated from the first resistor 22 and from the first switch 20. In addition, the reference source 52 is coupled to the analog-to-digital converter 50 and delivers the reference signal to the analog-to-digital converter 50.

The analog-to-digital converter 50 delivers output values to a control unit in the form of a microcontroller 58. The microcontroller 58 is connected to the first switch 20 and to the second switch 56. The microcontroller 58 is able to actuate the switches 20, 56.

The named resistors 22, 24, 28, 44, 46, 48, 54 together with the reference source 52 and the operational amplifiers 32, 42 of the voltage follower 30 and of the inverting amplifier 40 form a conditioning circuit 60.

If a voltage signal (i.e. the input signal) at the connector terminals 12 is to be measured in the operation of the circuit arrangement 10, the first circuit 20 is closed and the second switch 56 is opened. The input signal is thus supplied to the voltage divider formed from the first resistor 22 and the second resistor 24. The voltage divider can, for example, carry out a division in a ratio of 1:10 (i.e. the first resistor 22 is nine times the amount of the second resistor 24). A signal of the magnitude of 10% of the input signal is then supplied to the voltage follower 30 and is transmitted to its output 38.

The reference signal of the reference source 52 is added to this signal via the seventh resistor 54 and the result of this addition is supplied to the inverting amplifier 40. The inverting amplifier 40 can in particular have an amplification factor of minus one. The thus inverted signal is then output to the analog-to-digital converter 50 as a measured signal and is converted into a digital value by the analog-to-digital converter 50.

If now an offset error of the circuit arrangement 10 is to be determined, the first switch 20 and the second switch 56 are opened. The switches 20. 56 can e.g. be solid state relays. In the ideal case, a signal of 0 volts is consequently applied to the voltage divider since the latter is only coupled to the ground potential 14. A signal of 0 volts should accordingly still be present after the voltage follower 30 and the reference signal is added to it. After the inversion of the reference signal, a digital value generated by the analog-to-digital converter 50 can be compared with an expected value that would have arisen on a conversion of only the reference signal. If there is a difference between the expected digital value and the actually measured digital value, this difference corresponds to the offset of the circuit arrangement 10.

The first switch 20 is opened and the second switch 56 is closed for the determination of a gain error. The reference signal is hereby supplied to the input circuit 18 (more precisely to the first circuit 20) and simultaneously to the voltage divider that is formed from the first resistor 22 and the second resistor 24. The reference signal is reduced by the voltage divider and is supplied to the inverting amplifier 40 via the voltage follower 30, with the reference signal being added to the reduced reference signal between the voltage follower 30 and the inverting amplifier 40. The signal arising in this respect is in turn inverted and supplied to the analog-to-digital converter 50. A factor that corresponds to the gain error of the circuit arrangement 10 can be determined from a difference between an expected digital value of the analog-to-digital converter 50 and the actual digital value.

The offset error and the gain error can be determined by the microcontroller 58 in a cyclically repeating manner in the operation of the circuit arrangement 10. The respective current offset error and gain error can be used to correct the output digital values (i.e. the measured results) and thus to increase the accuracy of the circuit arrangement.

The second embodiment of the circuit arrangement 10 shown in FIG. 2 differs from the first embodiment of the circuit arrangement 10 of FIG. 1 only in that the second embodiment has a shunt resistor 62 between the connector terminals 12a, 12b that enables the circuit arrangement 10 to measure currents indirectly.

REFERENCE NUMERAL LIST 10 circuit arrangement
12a, 12b connector terminals
14 ground potential
16 EMC protective circuit
18 input circuit
20 first switch
22 first resistor
24 second resistor
26 output of the voltage divider
28 third resistor
30 voltage follower
32 first operational amplifier
34 non-inverting input
36 inverting input
38 output
40 inverting amplifier
42 second operational amplifier
44 fourth resistor
46 fifth resistor
48 sixth resistor
50 analog-to-digital converter
52 reference source
54 seventh resistor
56 second switch
58 microcontroller
60 conditioning circuit
62 shunt resistor

The invention claimed is:
1. A circuit arrangement for evaluating an analog electrical signal, the circuit arrangement comprising:
a control device;
an input circuit for applying an input signal;

a conditioning circuit electrically connected to the input circuit for converting the input signal into a measured signal;

an analog-to-digital converter electrically connected to the conditioning circuit for converting the measured signal into a digital value;

a reference source that outputs a known reference signal;

a first switch for selectively separating the input signal from the conditioning circuit or supplying the input signal to the conditioning circuit; and a second switch for selectively supplying the reference signal to the input circuit or separating the reference signal from the input circuit, wherein the control device is configured to determine an offset error of the circuit arrangement when the input signal is separated from the conditioning circuit and the reference signal is not supplied to the input circuit, such that a zero voltage signal is applied to a voltage divider of the conditioning circuit, wherein the control device is further configured to determine a gain error of the circuit arrangement when the input signal is separated from the conditioning circuit and the reference signal is supplied to the input circuit, and wherein the control device is further configured to recognize component defects of the circuit arrangement with respect to at least one of the offset error and the gain error and to further output a warning signal upon recognition of a component defect.

2. The circuit arrangement in accordance with claim 1, wherein the control device is connected to the analog-to-digital converter and corrects at least one of the gain error and the offset error in the digital value.

3. The circuit arrangement in accordance with claim 1, wherein the control device is configured to repeatedly determine at least one of the offset error and the gain error.

4. The circuit arrangement in accordance with claim 1, wherein the control device is configured to determine the offset error and the gain error after one another and to evaluate the input signal between the determination of the offset error and of the gain error.

5. The circuit arrangement in accordance with claim 1, wherein the input circuit comprises two connector terminals for the input signal and a protective circuit.

6. The circuit arrangement in accordance with claim 5, wherein one of the connector terminals is connected to a ground potential.

7. The circuit arrangement in accordance with claim 1, wherein the conditioning circuit comprises an impedance converter.

8. The circuit arrangement in accordance with claim 7, wherein the impedance converter is a voltage follower.

9. The circuit arrangement in accordance with claim 1, wherein the conditioning circuit comprises an amplifier.

10. The circuit arrangement in accordance with claim 1, wherein the amplifier is an inverting amplifier.

11. The circuit arrangement in accordance with claim 1, wherein the reference source comprises a voltage source.

12. The circuit arrangement in accordance with claim 1, wherein the reference source comprises a current source.

13. The circuit arrangement in accordance with claim 1, wherein a magnitude of the reference signal is changeable.

14. The circuit arrangement in accordance with claim 1, further comprising:

a second input circuit for applying the input signal;

a second conditioning circuit electrically connected to the second input circuit for changing the input signal into a second measured signal;

a second analog-to-digital converter electrically connected to the second conditioning circuit for converting the second measured signal into a second digital value; and a second reference source that outputs a known second reference signal, wherein a further first switch is provided that selectively separates the input signal from the second conditioning circuit or supplies it to the second conditioning circuit, and a further second switch is provided that selectively supplies the second reference signal to the second input circuit or separates it from the second input circuit, wherein the control device is configured to determine a second offset of the circuit arrangement when the input signal is separated from the second conditioning circuit and the second reference signal is not supplied to the second input circuit, and wherein the control device is configured to determine a second gain error of the circuit arrangement when the input signal is separated from the second conditioning circuit and the second reference signal is supplied to the second input circuit.

15. The circuit arrangement in accordance with claim 14, wherein the control device is configured to determine at least one of the second offset error and the second gain error at different points in time than at least one of the offset error and the gain error.

16. The circuit arrangement in accordance with claim 1, wherein a magnitude of the reference signal is settable.

17. The circuit arrangement in accordance with claim 1, wherein a magnitude of the reference signal is changeable and settable.

18. A method of evaluating an analog electrical signal, comprising the steps of:

applying an input signal to an input circuit;

converting the input signal into a measured signal, wherein a conditioning circuit electrically connected to the input circuit converts the input signal into the measured signal;

converting the measured signal into a digital value, wherein an analog-to-digital converter electrically connected to the conditioning circuit converts the measured signal into the digital value;

outputting a known reference signal from a reference source;

a first switch either selectively separating the input signal from the conditioning circuit or selectively supplying the input signal to the conditioning circuit;

a second switch either selectively supplying the reference signal to the input circuit or selectively separating the reference signal from the input circuit;

determining an offset error when the input signal is separated from the conditioning circuit and the reference signal is not supplied to the input circuit, such that a zero voltage signal is applied to a voltage divider of the conditioning circuit;

determining a gain error when the input signal is separated from the conditioning circuit and the reference signal is supplied to the input circuit;

recognizing component defects of the circuit arrangement with respect to at least one of the offset error and the gain error; and outputting a warning signal upon recognition of a component defect.

19. A circuit arrangement for evaluating an analog electrical signal, the circuit arrangement comprising:
a control device;
an input circuit for applying an input signal;
a conditioning circuit electrically connected to the input circuit for converting the input signal into a measured signal;
an analog-to-digital converter electrically connected to the conditioning circuit for converting the measured signal into a digital value;
a reference source that outputs a known reference signal;
a first switch for selectively separating the input signal from the conditioning circuit or supplying the input signal to the conditioning circuit;
a second switch for selectively supplying the reference signal to the input circuit or separating the reference signal from the input circuit;
a second input circuit for applying the input signal;
a second conditioning circuit electrically connected to the second input circuit for changing the input signal into a second measured signal;
a second analog-to-digital converter electrically connected to the second conditioning circuit for converting the second measured signal into a second digital value;
a second reference source that outputs a known second reference signal;
a third switch for selectively separating the input signal from the second conditioning circuit or supplying it to the second conditioning circuit; and
a fourth switch for selectively supplying the second reference signal to the second input circuit or separating it from the second input circuit,
wherein the control device is configured to determine an offset error of the circuit arrangement when the input signal is separated from the conditioning circuit and the reference signal is not supplied to the input circuit, such that a zero voltage signal is applied to a voltage divider of the conditioning circuit,
wherein the control device is further configured to determine a gain error of the circuit arrangement when the input signal is separated from the conditioning circuit and the reference signal is supplied to the input circuit,
wherein the control device is further configured to recognize component defects of the circuit arrangement with respect to at least one of the offset error and the gain error and to further output a warning signal upon recognition of a component defect,
wherein the control device is further configured to determine a second offset of the circuit arrangement when the input signal is separated from the second conditioning circuit and the second reference signal is not supplied to the second input circuit, and
wherein the control device is further configured to determine a second gain error of the circuit arrangement when the input signal is separated from the second conditioning circuit and the second reference signal is supplied to the second input circuit.

* * * * *